United States Patent
Osada

(10) Patent No.: US 7,686,985 B2
(45) Date of Patent: *Mar. 30, 2010

(54) GALLIUM OXIDE-ZINC OXIDE SPUTTERING TARGET, METHOD OF FORMING TRANSPARENT CONDUCTIVE FILM, AND TRANSPARENT CONDUCTIVE FILM

(75) Inventor: Kozo Osada, Ibaraki (JP)

(73) Assignee: Nippon Mining & Metals Co., Ltd, Tokyo (JP)

( * ) Notice: Subject to any disclaimer, the term of this patent is extended or adjusted under 35 U.S.C. 154(b) by 175 days.

This patent is subject to a terminal disclaimer.

(21) Appl. No.: 11/994,025

(22) PCT Filed: May 30, 2006

(86) PCT No.: PCT/JP2006/310734

§ 371 (c)(1),
(2), (4) Date: Dec. 27, 2007

(87) PCT Pub. No.: WO2007/000867

PCT Pub. Date: Jan. 4, 2007

(65) Prior Publication Data

US 2009/0120786 A1     May 14, 2009

(30) Foreign Application Priority Data

Jun. 28, 2005    (JP)   ............................. 2005-187554
Oct. 27, 2005    (JP)   ............................. 2005-313219

(51) Int. Cl.
    *H01B 1/08*       (2006.01)
    *H01B 5/14*       (2006.01)
    *B05D 5/12*       (2006.01)
    *C23C 14/34*     (2006.01)
    *G02B 1/10*       (2006.01)
    *G02F 1/1343*    (2006.01)

(52) U.S. Cl. .............................. 252/519.51; 252/520.2; 204/192.13

(58) Field of Classification Search ............ 252/519.51, 252/520.2; 204/192.15, 298.13
See application file for complete search history.

(56) References Cited

U.S. PATENT DOCUMENTS 5,672,427 A     9/1997    Hagiwara et al.

(Continued)

FOREIGN PATENT DOCUMENTS

JP        2000-195101 A     7/2000

OTHER PUBLICATIONS

One Page English Language Abstract of JP 2002-075062, Mar. 15, 2002.

(Continued)

*Primary Examiner*—Mark Kopec
(74) *Attorney, Agent, or Firm*—Howson & Howson LLP

(57) ABSTRACT

Provided is a high density gallium oxide-zinc oxide series sintered body sputtering target for forming a transparent conductive film containing 20 to 500 mass ppm of aluminum oxide. In a gallium oxide ($Ga_2O_3$)-zinc oxide (ZnO) series sputtering target (GZO series target) for forming a transparent conductive film, trace amounts of specific elements are added to obtain a target capable of improving the conductivity and the bulk density of the target; in other words, capable of improving the component composition to increase the sintered density, inhibit the formation of nodules, and prevent the generation of an abnormal electrical discharge and particles. Also provided are a method for forming a transparent conductive film using such a target, and a transparent conductive film formed thereby.

14 Claims, 2 Drawing Sheets

U.S. PATENT DOCUMENTS

| | | | |
|---|---|---|---|
| 6,528,442 | B1 * | 3/2003 | Kuwano et al. .......... 501/41 |
| 6,569,548 | B2 | 5/2003 | Yamamoto et al. |
| 6,843,975 | B1 | 1/2005 | Suzuki |
| 7,252,794 | B2 | 8/2007 | Suzuki |
| 7,279,211 | B2 | 10/2007 | Yahagi et al. |
| 2006/0147740 | A1 | 7/2006 | Hosono et al. |
| 2007/0098626 | A1 | 5/2007 | Shindo et al. |
| 2008/0299415 | A1 | 12/2008 | Hosono et al. |
| 2009/0085014 | A1 | 4/2009 | Ikisawa et al. |
| 2009/0101493 | A1 * | 4/2009 | Nakayama et al. ..... 204/192.11 |
| 2009/0197757 | A1 * | 8/2009 | Fukushima .......... 501/127 |

OTHER PUBLICATIONS

One Page English Language Abstract of JP 04-219359, Aug. 10, 1992.

One Page English Language Abstract of JP 61-205619, Sep. 11, 1986.

One Page English Language Abstract of JP 09-320344, Dec. 12, 1997.

One Page English Language Abstract of JP 06-177407, Jun. 24, 1994.

One Page English Language Abstract of JP 2001-035252, Feb. 9, 2001.

Unpublished Co-Pending U.S. Appl. No. 12/094,024, which is the national phase of PCT/JP2006/322944 filed Nov. 17, 2006.

Unpublished Co-Pending U.S. Appl. No. 12/282,933, which is the national phase of PCT/JP2007/052928 filed Feb. 19, 2007.

Unpublished Co-Pending U.S. Appl. No. 11/993,944, which is the national phase of PCT/JP2006/311270 filed Jun. 6, 2006.

Unpublished Co-Pending U.S. Appl. No. 12/307,380, which is the national phase of PCT/JP2007/060487 filed May 23, 2007.

Sumiya et al., "SIMS Analysis of ZnO Films co-doped with N and Ga by Temperature Gradient Pulsed Laser Deposition", Applied Surface Science 223, pp. 206-209, 2004.

Gopalakrishnan et al., "Comparison of ZnO:GaN film on Si(111) and Si(100) Substrates by Pulsed Laser Deposition", Physica B 376-377, pp. 756-759, 2006.

Yuan et al., "p-Type Conduction in AL-N co-doped ZnO Films", Materials Letters 58, pp. 3741-3744, Aug. 19, 2004.

Look et al., "The Future of ZnO Light Emitters", Phys. Stan. Sol. (a) 201, No. 10, pp. 2203-2212, Jul. 22, 2004.

ESP@CENET Database, English Abstract of JP 10-306367, Nov. 17, 1998.

ESP@CENET Database, English Abstract of JP 10-297964, Nov. 10, 1998.

ESP@CENET Database, English Abstract of JP 11-256320, Sep. 21, 1999.

ESP@CENET Database, English Abstract of JP 2002-363732, Dec. 18, 2002.

ESP@CENET Database, English Abstract of JP 2005-219982, Aug. 18, 2005.

ESP@CENET Database, English Abstract of JP 07-118015, May 9, 1995.

ESP@CENET Database, English Abstract of JP 09-143703, Jun. 3, 1997.

* cited by examiner

[Fig. 1]
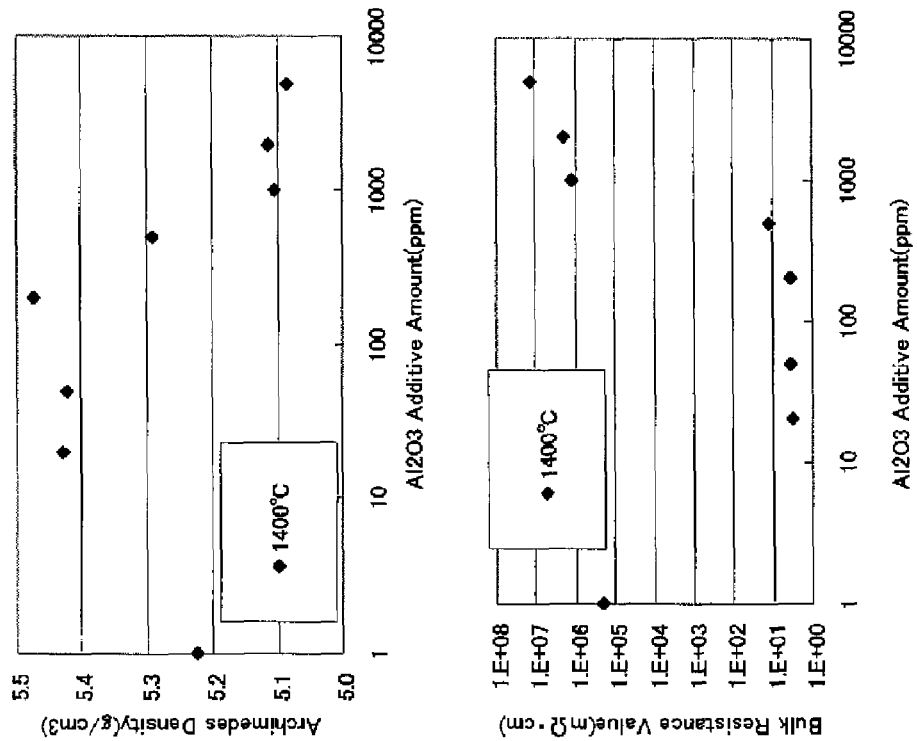
[Fig. 2]
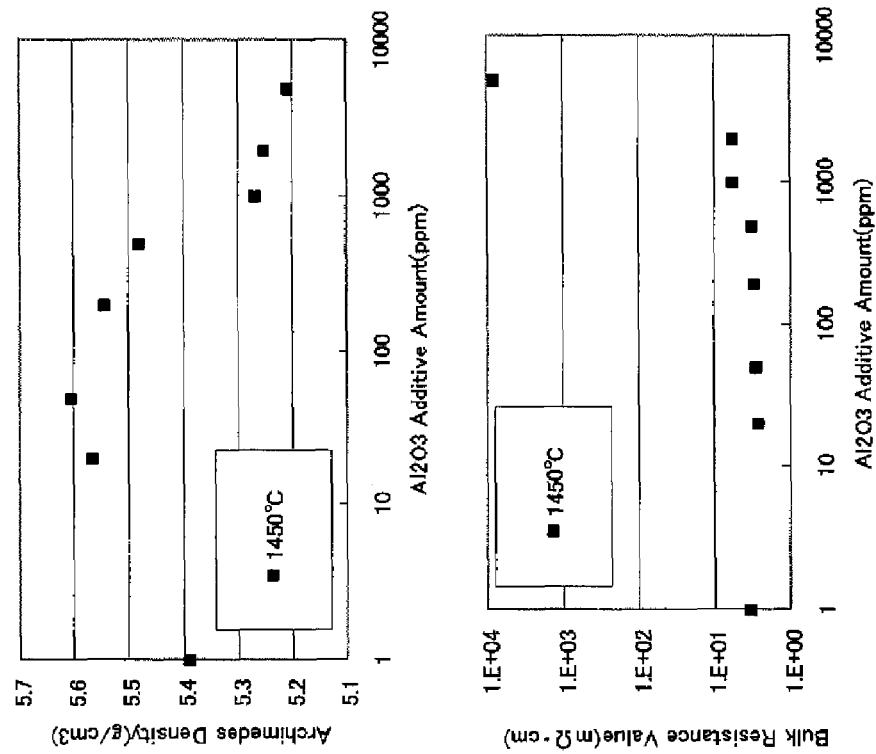

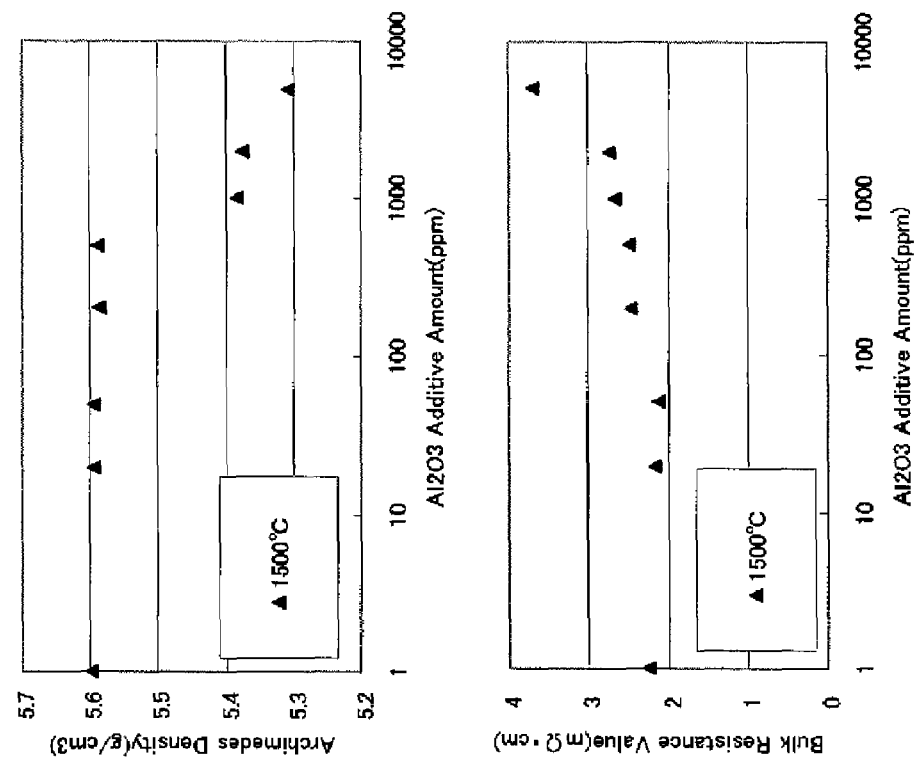
[Fig. 3]

GALLIUM OXIDE-ZINC OXIDE SPUTTERING TARGET, METHOD OF FORMING TRANSPARENT CONDUCTIVE FILM, AND TRANSPARENT CONDUCTIVE FILM

BACKGROUND OF THE INVENTION

The present invention relates to a gallium oxide ($Ga_2O_3$)-zinc oxide (ZnO) series sputtering target (GZO series target) for obtaining a transparent conductive film capable of maintaining a favorable optical transmission factor and conductivity, as well as to a method of forming a transparent conductive film using such a target and a transparent conductive film formed thereby.

Conventionally, as a transparent conductive film, an ITO film (i.e., film in which tin is doped in indium oxide) is superior in transparency and conductivity, and is widely used as a transparent electrode (film) of display devices such as a liquid crystal display and an electro luminescence display, as well as in solar batteries. Nevertheless, since indium, which is the primary component of ITO, is expensive, there is a problem in that the manufacturing cost will increase.

Due to the foregoing reasons, the usage of a GZO film as a substitute for the ITO film is being proposed. This GZO film is advantageous since it is a zinc oxide series film having gallium oxide ($Ga_2O_3$)-zinc oxide (ZnO) as its primary component, and is inexpensive. The GZO film is known to encounter a phenomenon of increased conductivity due to the oxygen defect of ZnO, which is the primary component thereof, and the increased use of such GZO film can be realized if the film characteristics such as conductivity and optical transparency come near the ITO film.

As a method of forming the GZO film, the sputtering method is primarily used, and, in particular, direct current (DC) sputtering, radio frequency (RF) sputtering or magnetron sputtering is used from the perspective of operability and film stability.

Formation of a film based on the sputtering method is conducted by physically colliding a positive ion such as an Ar ion to a target disposed on a negative electrode, using such collision energy to discharge a material for configuring a target, and laminating a film having roughly the same composition as the target material on a substrate on the opposite positive electrode.

The coating based on the foregoing sputtering method is characterized in being able to form a thin film of angstrom units to a thick film of several ten μm with a stable deposition speed by adjusting the processing time and power supply.

Several proposals have been made regarding a sintered body sputtering target for forming this kind of GZO film, and a transparent conductive film formed thereby.

For example, Patent Document 1 proposes a zinc oxide series sintered body target in which an abnormal electrical discharge does not occur in a part thereof and which is able to form a stable thin film. In Patent Document 1, a $Ga_2O_3$—ZnO target sintered body is used as a part of the target material, and zinc oxide in which titanium oxide, germanium oxide, aluminum oxide, magnesium oxide, indium oxide, and tin oxide is selectively added at 1 to 5 weight % is used as the primary component.

Patent Document 2 proposes a GZO sintered body sputtering target without any abnormal electrical discharge and which is able to form a stable thin film. In Patent Document 2, technology is proposed for pulverizing the powders of zinc oxide and gallium oxide to a grain size of 1 μm or less, adjusting the sintering temperature at 1300 to 1550° C., and improving the density by performing sintering while introducing oxygen.

Patent Document 3 proposes a GZO sintered body sputtering target with a high transmission factor and a low resistance value and in which the occurrence of an abnormal electrical discharge is rare over a long period of time. In Patent Document 3, proposed is a ZnO series sintered body in which Ga is added at 3 to 7 atomic %, and a third element selected from Al, B, In, Ge, Si, Sn, and Ti is added at 0.3 to 3 atomic %.

Patent Document 4 proposes technology of performing sputtering in an atmosphere of hydrogen gas and inert gas in order to prevent changes in the electrical characteristics and optical characteristics due to zinc oxide reacting with moisture.

Generally speaking, a major problem in forming a GZO film is that minute protrusions called nodules occur in the erosion portion of the target surface due to sputtering, coarse grains (particles) float in the sputtering chamber caused by the abnormal electrical discharge and splash due to such nodules, and such particles adhere to the formed film and cause deterioration in quality. Further, the foregoing abnormal electrical discharge will cause an unstable plasma discharge, and there is a problem in that stable deposition cannot be realized.

Therefore, upon forming a conductive film on a substrate, it is necessary to periodically remove the nodules occurring on the sputtering target, and there is a problem in that this significantly deteriorates the productivity. Thus, a target which does not generate nodules or an abnormal electrical discharge phenomenon is in demand.

In particular, recently, the tendency is that displays are being enlarged, and deposition on a large area is required. Thus, a target capable of stable deposition is in particular being demanded.

In the foregoing patent documents, the problem of abnormal electrical discharge is being pointed out, and, as measures for reducing such abnormal electrical discharge, in Patent Document 1 described above, titanium oxide, germanium oxide, aluminum oxide, magnesium oxide, indium oxide, and tin oxide is selectively added at 1 to 5 weight %. In Patent Document 3, a third element selected from Al, B, In, Ge, Si, Sn, and Ti is added at 0.3 to 3 atomic %.

Each of the foregoing documents attempts to prevent the abnormal electrical discharge by increasing the density of the sintered body and reducing the holes in the sintered body. Nevertheless, even with the use of these additive materials, there is a problem in that the sintered density cannot be sufficiently increased, and the bulk (volume) resistance value remains high.

Further, although it is possible to improve the manufacture process of the target, a complex manufacture process will cause increased costs. In addition, when attempting to increase the density by improving the sintering method or device, there is a problem in that the equipment must be enlarged, and this cannot be considered to be an industrially efficient method.

Comprehensively, by adding trace elements; that is, by changing the component composition of the GZO sintered body, it is possible to improve the target density, prevent the formation of nodules, and inhibit the generation of an abnormal electrical discharge phenomenon and particles, and this would be a simple and effective method. Nevertheless, change in the component composition will aggravate the bulk resistance value of the target, and, since the sintered density will not necessarily be improved, there is a problem in that the examples described in the foregoing Patent Documents are insufficient as measures in overcoming the conventional problems.

[Patent Document 1] Japanese Patent Laid-Open Publication No. H10-306367

[Patent Document 2] Japanese Patent Laid-Open Publication No. H10-297964

[Patent Document 3] Japanese Patent Laid-Open Publication No. H11-256320

[Patent Document 4] Japanese Patent Laid-Open Publication No. 2002-363732

SUMMARY OF THE INVENTION

In light of the foregoing problems of conventional technology, the gallium oxide ($Ga_2O_3$)-zinc oxide (ZnO) series sputtering target (GZO series target) of the present invention improves the conductivity and density by adding trace amounts of a specific element. In other words, the present invention provides a target capable of improving the component composition to increase the sintered density, inhibit the formation of nodules, and prevent the generation of abnormal electrical discharge and particles. The present invention further provides a method of forming a transparent conductive film using such a target, and a transparent conductive film formed thereby.

Based on the above, the present invention provides:

1) A high density gallium oxide-zinc oxide series sintered body sputtering target containing 20 to 500 mass ppm of aluminum oxide;

2) The high density gallium oxide-zinc oxide series sintered body sputtering target according to paragraph 1) above, containing 0.1 to 10 mass % of gallium oxide;

3) The high density gallium oxide-zinc oxide series sintered body sputtering target according to paragraph 1) or paragraph 2) above, wherein the sintered density is 5.55 g/cm$^3$ or higher;

4) The high density gallium oxide-zinc oxide series sintered body sputtering target according to paragraph 1) or paragraph 3) above, wherein the bulk resistance value of the target is 3.0 mΩ·cm or less;

5) A transparent conductive film formation method for forming a thin film formed from gallium oxide-zinc oxide containing 20 to 500 mass ppm of aluminum oxide on a substrate based on a sputtering method using a gallium oxide-zinc oxide series target containing 20 to 500 mass ppm of aluminum oxide;

6) The transparent conductive film formation method according to paragraph 5) above, wherein the transparent conductive film contains 0.1 to 10 mass % of gallium oxide;

7) A transparent conductive film having superior conductivity formed from gallium oxide-zinc oxide series containing 20 to 500 mass ppm of aluminum oxide formed on a substrate with sputtering; and 8) The transparent conductive film having superior conductivity according to paragraph 7) above, wherein the transparent conductive film contains 0.1 to 10 mass % of gallium oxide.

The gallium oxide ($Ga_2O_3$)-zinc oxide (ZnO) series sputtering target (GZO series target) of the present invention contains 20 to 500 mass ppm of aluminum oxide ($Al_2O_3$), whereby it is possible to significantly increase the target density, and inhibit the bulk resistance value at a constant value. As a result, the present invention yields a superior effect of being able to obtain a target that inhibits the formation of nodules during the sputtering deposition, reduces the abnormal electrical discharge for a long period of time, and prevents the generation of particles.

Further, as a result of using the target, the present invention yields a significant effect in that it is possible to form a transparent conductive film having a high transmission factor and a low resistance value, and provide a transparent conductive film formed thereby.

BRIEF DESCRIPTION OF THE DRAWINGS

FIG. 1 is a graph showing the relationship of the additive amount of aluminum oxide ($Al_2O_3$), and the sintered density and the bulk resistance value when sintering the GZO series target of the Examples and Comparative Examples at 1400° C.;

FIG. 2 is a graph showing the relationship of the additive amount of aluminum oxide ($Al_2O_3$), and the sintered density and the bulk resistance value when sintering the GZO series target of the Examples and Comparative Examples at 1450° C.; and FIG. 3 is a graph showing the relationship of the additive amount of aluminum oxide ($Al_2O_3$), and the sintered density and the bulk resistance value when sintering the GZO series target of the Examples and Comparative Examples at 1500° C.

DETAILED DESCRIPTION OF THE INVENTION

Generally speaking, conductivity of the transparent conductive film is represented as sheet resistivity (Ω/□), and, ordinarily, sheet resistivity of roughly 5Ω/□ is required. In the application in the liquid crystal display screen described above, higher finess of the liquid crystal screen and lower sheet resistivity are required. The sheet resistivity is represented as a value obtained by dividing the specific resistance with the thickness of the transparent conductive film.

The area conductivity of the transparent conductive film is represented as the product of the conductivity (inverse of specific resistance) and the film thickness, and this conductivity σ ($Ω^{-1}·cm^{-1}$) is represented as the product of the charge e (coulomb) and the carrier mobility μ (cm$^2$/V·sec) of a carrier (electron hole or electron) contained in the film, and the carrier concentration n (cm$^{-3}$) (σ ($Ω^{-1}·cm^{-1}$)=e·μ·n).

Therefore, in order to improve the conductivity of the transparent conductive film and reduce the specific resistance (also referred to as resistivity) and the sheet resistivity, it is necessary to increase the carrier mobility μ (cm$^2$/V·sec) and/or the carrier concentration n (cm$^{-3}$).

The gallium oxide-zinc oxide series sintered body sputtering target of the present invention is superior as a target for forming a transparent conductive film having such film characteristics. Desirably, the added gallium oxide content is within the range of 0.1 to 10 mass %, and more preferably in the range of 2 to 7 mass %.

As a factor that influences the film characteristics during sputtering, there is the target density described above. Higher the target density, less the formation of nodules, and the generation of an abnormal electrical discharge and particles can be inhibited for a long period of time, and a favorable film and stable sputtering characteristics can be obtained.

Meanwhile, since the bulk resistance value of the target is directly reflected on the resistivity of the transparent conductive film, it is necessary to inhibit the increase of the bulk resistance value as much as possible.

As the dopant capable of achieving the high density in the gallium oxide-zinc oxide series sintered body sputtering target of the present invention, it has become known that 20 to 500 mass ppm of aluminum oxide ($Al_2O_3$) is extremely effective. Further, aluminum oxide has characteristics of dissolving in GZO, and maintaining the bulk resistance value at low levels as described later. Addition of such aluminum oxide is the most important aspect of the present invention.

If the aluminum oxide is less than 20 mass ppm, since it is not possible to achieve the high density of the target, aluminum oxide is added at 20 mass ppm or more. Meanwhile, if the aluminum oxide exceeds 500 mass ppm, the sintering density deteriorates drastically, and the bulk resistance value tends to increase. The excess addition of aluminum oxide will also entail a problem of inducing cracks in the target. Therefore, it is necessary to keep the aluminum content 500 mass ppm or less.

Further, the sintered density of the high density gallium oxide-zinc oxide series sintered body sputtering target according to the present invention is able to achieve a value of 5.55 g/cm$^3$ or higher, and even 5.6 g/cm$^3$ or higher by arbitrarily selecting the sintering conditions.

Moreover, the bulk resistance value of the high density gallium oxide-zinc oxide series sintered body sputtering target according to the present invention is able to achieve a value of 3.0 mΩ or less. A conventional gallium oxide-zinc oxide series sintered body sputtering target is not able to simultaneously achieve a high density where the sintered density is 5.6 g/cm$^3$ or higher and a bulk resistance value of 3.0 mΩ or less.

Since the bulk resistance value of the target is directly reflected on the resistivity of the transparent conductive film, it is possible to obtain a transparent conductive film of the gallium oxide-zinc oxide series containing 0.1 to 10 mass % of gallium oxide, and which is superior in conductivity and optical transparency.

There is no particular limitation in the manufacturing method of the GZO according to the present invention, and a prescribed amount (0.1 to 10 mass %) of gallium oxide ($Ga_2O_3$) powder, trace amounts of aluminum oxide ($Al_2O_3$) powder (20 to 500 mass ppm) and residual quantity of zinc oxide (ZnO) powder are prepared.

Generally speaking, in order to improve the target density, it would be preferable if the powder before formation is as minute as possible. Ordinarily, the zirconia beads or zirconia lining container is used for pulverization. The pulverization media itself will not become a pollution source (contamination source). Thereby, there is a significant advantage in that the pulverization level can be improved, and a sputtering target having a higher purity and a higher density in comparison to conventional technology can be obtained.

Mixing and pulverization are performed in an attoritor, and a mixed powder slurry having a median size of 0.8 μm can be obtained. This slurry is granulated to obtain spherical granulated powder. Further, the granulated powder may be subject to press molding, and further subject to CIP (cold isostatic press). Then, this compact is subject to sintering in an oxygen atmosphere at a temperature of 1000 to 1600° C. for 1 to five hours to obtain a sintered body.

Incidentally, the sintering conditions can be arbitrarily changed, and the manufacturing method of powder can be changed from the method described above, and there is no particular limitation. Accordingly, it is possible to achieve a sintered density of 5.55 g/cm$^3$ or higher, and even 5.6 g/cm$^3$ or higher.

This sintered body is ground and cut and processed into a sputtering shape of a prescribed shape, and a gallium oxide-zinc oxide series sintered body sputtering target containing 0.1 to 10 mass % of gallium oxide is thereby obtained.

Subsequently, the sintered body sputtering target is used to perform DC sputtering, RF sputtering, or magnetron sputtering to a glass substrate in order to form a transparent electrode film. A glass of a normal optical transparency is used as the substrate, and there is no particular limitation on the glass that can be used.

Since the gallium oxide-zinc oxide series sintered body target has conductivity, it can be easily deposited with DC sputtering. Therefore, it is preferable to use DC sputtering to perform deposition since it is simplest, highly reliable and most stable. Representative examples of the DC sputtering conditions are shown below.

The sputtering conditions can be arbitrarily changed.
Sputtering gas: Ar: 90 to 100%, $O_2$: 10 to 0%
Sputtering gas pressure: 0.1 to 5 Pa
Electrical energy: 0.2 to 6 W/cm$^2$
Deposition speed: Approximately 100 to 300 Å/min
Substrate temperature: Room temperature to 300° C.

EXAMPLES

Examples of the present invention are now explained. Incidentally, these examples are merely illustrative, and the present invention shall in no way be limited thereby. In other words, the present invention shall only be limited by the scope hereof, and shall include the various modifications other than the Examples of this invention.

Examples 1 to 4

An $Al_2O_3$ powder having an average grain size of 1 μm or less after pulverizing a zirconia media was weighed at 20 mass ppm (Example 1), 50 mass ppm (Example 2), 200 mass ppm (Example 3), and 500 mass ppm (Example 4), and further weighed so that $Ga_2O_3$ powder is 5 mass % and the remainder is zinc oxide (ZnO). This powder was mixed and pulverized in an attoritor with zirconia ($Al_2O_3$) balls or beads as the pulverization media to obtain a mixed powder slurry having a median size of 0.8 μm.

This slurry was granulated to obtain spherical granulated powder. The granulated powder was subject to press molding, and further subject to CIP (cold isostatic press). The obtained compact was sintered in an oxygen atmosphere at a temperature of 1500° C. for four hours to obtain a sintered body. The sintered body was ground and cut and processed into a sputtering target of a prescribed shape.

The density and bulk resistance value of the obtained sintered body target were measured. The results are shown in Tables 1 to 3. Further, the results are represented in the graph illustrated in FIG. 1. Incidentally, the aluminum oxide ($Al_2O_3$) contained in the target was found by measuring the amount of aluminum with ICP (inductively-coupled plasma method), and finding the reduced quantity of $Al_2O_3$ in relation to the overall amount of the target. The amount of $Al_2O_3$ contained in the target was roughly the same as the additive amount before sintering.

The target density was measured with the Archimedes method. Further, the bulk resistance value was measured by randomly setting the location of measurement at 5 locations across the entire target subject to mirror polishing, and measuring such value using the four-probe method at a depth position of 2 mm from the surface of the cutting plane of the target, and the average value thereof was used.

TABLE 1

Sintering at 1400° C.

| | Al2O3 Concentration (mass ppm) | Sintering Density (g/cm3) | Bulk Resistance (mΩ · cm) | Nodule Coverage Factor (%) | Abnormal Electrical Discharge Count (After 10 Hours) |
|---|---|---|---|---|---|
| Example 1 | 20 | 5.43 | 3.18E+00 | 0.791 | 420 |
| Example 2 | 50 | 5.42 | 3.43E+00 | 0.811 | 429 |
| Example 3 | 200 | 5.47 | 3.50E+00 | 0.641 | 350 |
| Example 4 | 500 | 5.29 | 1.20E+01 | 1.262 | 641 |
| Comparative Example 1 | 0 | 5.23 | 2.09E+05 | — | — |
| Comparative Example 2 | 1000 | 5.10 | 1.28E+06 | — | — |
| Comparative Example 3 | 2000 | 5.11 | 2.02E+06 | — | — |
| Comparative Example 4 | 5000 | 5.08 | 1.24E+07 | — | — |

TABLE 2

Sintering at 1450° C.

| | Al2O3 Concentration (mass ppm) | Sintering Density (g/cm3) | Bulk Resistance (mΩ · cm) | Nodule Coverage Factor (%) | Abnormal Electrical Discharge Count (After 10 Hours) |
|---|---|---|---|---|---|
| Example 1 | 20 | 5.56 | 2.60E+00 | 0.345 | 211 |
| Example 2 | 50 | 5.60 | 2.69E+00 | 0.218 | 152 |
| Example 3 | 200 | 5.54 | 2.94E+00 | 0.417 | 245 |
| Example 4 | 500 | 5.48 | 3.14E+00 | 0.621 | 341 |
| Comparative Example 1 | 0 | 5.39 | 3.17E+00 | 0.925 | 483 |
| Comparative Example 2 | 1000 | 5.27 | 5.60E+00 | 1.341 | 678 |
| Comparative Example 3 | 2000 | 5.25 | 5.63E+00 | 1.401 | 705 |
| Comparative Example 4 | 5000 | 5.21 | 7.73E+06 | — | — |

TABLE 3

Sintering at 1500° C.

| | Al2O3 Concentration (mass ppm) | Sintering Density (g/cm3) | Bulk Resistance (mΩ · cm) | Nodule Coverage Factor (%) | Abnormal Electrical Discharge Count (After 10 Hours) |
|---|---|---|---|---|---|
| Example 1 | 20 | 5.60 | 2.16E+00 | 0.241 | 163 |
| Example 2 | 50 | 5.60 | 2.11E+00 | 0.244 | 164 |
| Example 3 | 200 | 5.59 | 2.45E+00 | 0.270 | 176 |
| Example 4 | 500 | 5.60 | 2.49E+00 | 0.231 | 158 |
| Comparative Example 1 | 0 | 5.60 | 2.23E+00 | 0.250 | 169 |
| Comparative Example 2 | 1000 | 5.38 | 2.65E+00 | 0.946 | 490 |
| Comparative Example 3 | 2000 | 5.38 | 2.74E+00 | 0.973 | 510 |
| Comparative Example 4 | 5000 | 5.31 | 3.70E+00 | 1.204 | 610 |

Table 1 and FIG. 1 show cases of sintering at 1400° C., Table 2 and FIG. 2 show cases of sintering at 1450° C., and Table 3 and FIG. 3 show cases of sintering at 1500° C. As shown in Table 1 to Table 3 and FIG. 1 to FIG. 3, the tendency is that the higher the sintering temperature becomes from 1400° C. to 1500° C., the density increases and the bulk resistance value decreases.

Nevertheless, when the sintering temperature rises, the material begins to evaporate (volatilize), and, since the amount of evaporation differs depending on the component configuring the target, there is a possibility that composition variations will occur. In particular, at a temperature of 1400° C. or higher, zinc oxide will partially evaporate from the target surface, and this becomes more prominent as the temperature gets higher. Although it is necessary to remove the layer subject to composition variation, if the layers subject to composition variation on the surface increase due to sintering at high temperatures, there is a problem in that the amount to be cut will increase, causing the yield ratio to deteriorate.

Even more than the energy loss due to high temperature sintering, the foregoing composition variation must be inhibited as much as possible. From this perspective, it is desirable to perform sintering at 1400° C. or less as much as possible, or at least in the vicinity thereof.

Therefore, although sintering at low temperatures is desirable, since this will lead to low density and high bulk resistance, it would be ideal to adjust the balance thereof and select a temperature according to the requisite conditions of density and bulk resistance in the target.

Table 1 and FIG. 1 show the case of sintering at 1400° C., and the high density gallium oxide-zinc oxide series sintered body sputtering target of the Examples in which 20 to 500 mass ppm of aluminum oxide was added showed significant improvements in the density and bulk resistance value in comparison to a gallium oxide-zinc oxide series sintered body sputtering target with no addition of $Al_2O_3$ (Comparative Example 1 described later).

In other words, the target of the Examples has a density of 5.29 to 5.47 g/cm$^3$, and a bulk resistance value of 3.18 to 12.0 mΩ·cm, and it is evident that favorable high density and low bulk resistance value were obtained.

Table 2 and FIG. 2 show the case of sintering at 1450° C., and the high density gallium oxide-zinc oxide series sintered body sputtering target of the Examples in which 20 to 500 mass ppm of aluminum oxide was added showed significant improvements in the density and bulk resistance value in comparison to a gallium oxide-zinc oxide series sintered body sputtering target with no addition of $Al_2O_3$ (Comparative Example 1 described later). In other words, the target of the Examples has a density of 5.48 to 5.60 g/cm$^3$, and a bulk resistance value of 2.60 to 3.14 mΩ·cm, and it is evident that further favorable high density and low bulk resistance value were obtained.

Table 3 and FIG. 3 show the case of sintering at 1500° C., and the high density gallium oxide-zinc oxide series sintered body sputtering target of the Examples in which 20 to 500 mass ppm of aluminum oxide was added showed roughly the same values as the density and bulk resistance value of a gallium oxide-zinc oxide series sintered body sputtering target with no addition of $Al_2O_3$ (Comparative Example 1 described later). In other words, the target of the Examples has a density of 5.59 to 5.60 g/cm$^3$, and a bulk resistance value of 2.11 to 2.49 Ω·cm.

As evident from the foregoing Examples, the addition of aluminum oxide achieves higher density and lower bulk resistance value superior to an additive-free target in cases of sintering at low temperatures; that is, at 1400° C., 1450° C. and 1500° C.

Subsequently, this sputtering target was used to perform DC sputtering on a glass substrate under the following conditions, and the generation of nodules (coverage factor) and abnormal electrical discharge were measured and observed. The generation of nodules (coverage factor) was measured based on surface measurement one hour after the commencement of sputtering, and the abnormal electrical discharge was measured based on the abnormal electrical discharge five hours after sputtering.

Sputtering gas: Ar (100%)
Sputtering gas pressure: 0.6 Pa
Electrical energy: 1500 W
Deposition speed: 120 Å/min As a result, the coverage factor of nodules was low, and the number of abnormal electrical discharges during sputtering could hardly be observed five hours after sputtering. Further, as shown in Tables 1 to 3, the number of abnormal electrical discharges was extremely low even ten hours after sputtering.

Further, the specific resistance (#·cm) of deposition and the film characteristics of the transmission factor % at 550 nm were examined, but these were comparable to a standard ITO film, and showed a favorable optical transmission factor and high conductivity. In the foregoing Examples, although a case was explained regarding a gallium oxide-zinc oxide series sintered body sputtering target having $Ga_2O_3$ in an additive amount of 5 mass %, the same effects can be obtained so as long as gallium oxide is added within the range of 0.1 to 10 mass %.

Comparative Examples 1 to 4

An $Al_2O_3$ additive-free powder (Comparative Example 1), and a $Al_2O_3$ powder having an average grain size of 1 μm or less after pulverizing a zirconia media were respectively weighed at 1000 mass ppm (Comparative Example 2), 2000 mass ppm (Comparative Example 3), and 5000 mass ppm (Comparative Example 4), and further weighed so that $Ga_2O_3$ powder is 5 mass % and the remainder is zinc oxide (ZnO).

Subsequently, this powder was mixed and pulverized in an attoritor with zirconia ($Al_2O_3$) balls (beads) as the pulverization media to obtain a mixed powder slurry having a median size of 0.8 μm. This slurry was granulated to obtain spherical granulated powder.

The granulated powder was subject to press molding, and further subject to CIP (cold isostatic press). The obtained compact was sintered in the atmosphere at the temperatures of 1400° C., 1450° C., and 1500° C. for five hours, respectively, to obtain a sintered body. The sintered body was ground and cut and processed into a sputtering target of a prescribed shape.

The density and bulk resistance value of the obtained sintered body target were measured. The results are similarly shown in Table 1, Table 2, and Table 3. Further, the results are represented in the graphs illustrated in FIG. 1, FIG. 2, and FIG. 3. Incidentally, the density and bulk resistance value of the aluminum oxide ($Al_2O_3$) contained in the target were sought with the same methods as the Examples.

As shown in Table 1 and FIG. 1, in the case of Comparative Example 1 which is an additive-free gallium oxide-zinc oxide series sintered body sputtering target, the sintered density was 5.23 g/cm$^3$ and the bulk resistance value was 2.09×10$^5$ mΩ·cm (2.09 E+05 mΩ·cm) when sintering was performed at 1400° C., the sintered density was 5.39 g/cm$^3$ and the bulk resistance value was 3.17 mΩ·cm when sintering was performed at 1450° C., and the sintered density was 5.52 g/cm³ and the bulk resistance value was 3.00 mΩ·cm when sintering was performed at 1500° C.

As shown above, under the same low-temperature sintering conditions, the Comparative Examples showed lower density and higher bulk resistance in comparison to the Examples, and it is evident that the Comparative Examples are inadequate as a gallium oxide-zinc oxide series sintered body sputtering target.

The gallium oxide-zinc oxide series sintered body sputtering target containing 1000 mass ppm of $Al_2O_3$ shown in Comparative Example 2 showed drastic deterioration in density when sintering was performed at 1400° C., when sintering was performed at 1450° C., and when sintering was performed at 1500° C., and resulted in significantly lower density in comparison to the Examples. Further, the bulk resistance value was abnormally high when sintering was performed at 1400° C. Moreover, the bulk resistance value also tended rise gradually when sintering was performed at 1450° C., and when sintering was performed at 1500° C. It is evident that none of the Comparative Examples is adequate as a target.

Subsequently, under the same conditions as the Examples, these sintered body targets were used to perform DC sputtering on a glass substrate in order to form a transparent electrode film based on the following conditions.

As with the Examples, the generation of nodules (coverage factor) was measured based on surface measurement one hour after the commencement of sputtering, and the abnormal electrical discharge was measured based on the abnormal electrical discharge five hours after sputtering. The results are shown in Table 1.

When the gallium oxide-zinc oxide series sintered body sputtering target with no addition of aluminum oxide of Comparative Example 1, with the addition of 1000 mass ppm of Comparative Example 2, with the addition of 2000 mass ppm of Comparative Example 3, and with the addition of 5000 mass ppm of Comparative Example 4 were sintered at 1400° C., the bulk resistance was too high and DC sputtering could not be performed. In addition, when sintering was performed at 1450° C., with the gallium oxide-zinc oxide series sintered body sputtering target with the addition of 5000 mass ppm, the bulk resistance was too high and DC sputtering could not be performed.

Further, the targets sintered at 1450° C. and 1500° C. could be used in DC sputtering, but the coverage factor of nodules and the number of abnormal electrical discharges were numerous and inferior.

Meanwhile, with the gallium oxide-zinc oxide series sintered body sputtering target shown in Comparative Examples 2, 3 and 4, in the respective cases where sintering was performed at 1400° C., performed at 1450° C., and performed at 1500° C., in comparison to the Examples, the coverage factor of nodules and the number of abnormal electrical discharges were numerous and inferior. In addition, with the gallium oxide-zinc oxide series sintered body sputtering target with the addition of 5000 mass ppm, the generation of cracks was observed.

As described above, the addition of an adequate amount of aluminum oxide is able to improve the sputtering characteristics; specifically, it is possible to inhibit the coverage factor of nodules, inhibit the occurrence of abnormal electrical discharges caused by such nodules, inhibit the generation of particles caused by abnormal electrical discharge splashes, and effectively inhibit deterioration in the quality of the conductive film.

Nevertheless, these effects cannot be achieved if the additive amount of aluminum oxide is less than 20 mass ppm, and there are problems in that the bulk resistance value will increase, the sintered density cannot be improved, and cracks will occur if the additive amount of aluminum oxide exceeds 500 mass ppm. Thus, it is suitable to set the additive amount of aluminum oxide to be within the range of 20 mass ppm to 500 mass ppm.

The gallium oxide ($Ga_2O_3$)-zinc oxide (ZnO) series sputtering target (GZO series target) of the present invention contains 20 to 500 mass ppm of aluminum oxide ($Al_2O_3$), whereby it is possible to significantly increase the target density, and inhibit the bulk resistance value at a constant value. As a result, the present invention is able to inhibit the formation of nodules during the sputtering deposition, reduce the abnormal electrical discharge for a long period of time, and prevent the generation of particles. Therefore, it is possible to obtain a transparent conductive film capable of maintaining a favorable optical transmission factor and conductivity.

Accordingly, the present invention can be widely used as a transparent electrode (film) of display devices such as a liquid crystal display and an electro luminescence display, as well as in solar batteries.

The invention claimed is:

1. A gallium oxide-zinc oxide series sintered body sputtering target containing 20 to 500 mass ppm of aluminum oxide and having a sintered density of 5.55 g/cm³ or higher.

2. The gallium oxide-zinc oxide series sintered body sputtering target according to claim 1, containing 0.1 to 10 mass % of gallium oxide.

3. The gallium oxide-zinc oxide series sintered body sputtering target according to claim 2, wherein the sintered density is 5.6 g/cm³ or higher.

4. The gallium oxide-zinc oxide series sintered body sputtering target according to claim 3, wherein the bulk resistance value of the target is 3.0 mΩ·cm or less.

5. The gallium oxide-zinc oxide series sintered body sputtering target according to claim 1, wherein the sintered density is 5.6 g/cm³ or higher.

6. The gallium oxide-zinc oxide series sintered body sputtering target according to claim 5, wherein the bulk resistance value of the target is 3.0 mΩ·cm or less.

7. The gallium oxide-zinc oxide series sintered body sputtering target according to claim 1, wherein the bulk resistance value of the target is 3.0 mΩ·cm or less.

8. A transparent conductive film formation method comprising the step of forming a thin film formed from gallium oxide-zinc oxide containing 20 to 500 mass ppm of aluminum oxide on a substrate by performing sputtering with a gallium oxide-zinc oxide series target containing 20 to 500 mass ppm of aluminum oxide and having a sintered density of 5.55 g/cm³ or higher to deposit the thin film onto the substrate.

9. The transparent conductive film formation method according to claim 8, wherein the transparent conductive film contains 0.1 to 10 mass % of gallium oxide.

10. A method according to claim 8, wherein the target used in said sputtering has a bulk resistance value of 3.0 mΩ·cm or less.

11. A method according to claim 10, wherein the sintered density of the target used in said sputtering is 5.6 g/cm³ or higher.

12. A method according to claim 11, wherein the target used in said sputtering has a bulk resistance value of 3.0 mΩ·cm or less.

13. A transparent conductive film consisting essentially of gallium oxide-zinc oxide containing 20 to 500 mass ppm of aluminum oxide formed on a substrate with sputtering.

14. The transparent conductive film according to claim 13, wherein the transparent conductive film contains 0.1 to 10 mass % of gallium oxide.

* * * * *

UNITED STATES PATENT AND TRADEMARK OFFICE
CERTIFICATE OF CORRECTION

PATENT NO. : 7,686,985 B2
APPLICATION NO. : 11/994025
DATED : March 30, 2010
INVENTOR(S) : Kozo Osada It is certified that error appears in the above-identified patent and that said Letters Patent is hereby corrected as shown below:

Column 10, line 22, --resistance (#•cm)-- should read --resistance (Ω•cm)--

Signed and Sealed this

Fifteenth Day of June, 2010

David J. Kappos
*Director of the United States Patent and Trademark Office*